(12) United States Patent
Tsumura (10) Patent No.: US 7,739,430 B2
(45) Date of Patent: Jun. 15, 2010

(54) SEMICONDUCTOR INTEGRATED CIRCUIT

(75) Inventor: Keiichi Tsumura, Takarazuka (JP)

(73) Assignee: Panasonic Corporation, Osaka (JP)

( * ) Notice: Subject to any disclaimer, the term of this patent is extended or adjusted under 35 U.S.C. 154(b) by 278 days.

(21) Appl. No.: 11/291,781

(22) Filed: Dec. 2, 2005

(65) Prior Publication Data

US 2006/0120169 A1  Jun. 8, 2006

(30) Foreign Application Priority Data

Dec. 2, 2004  (JP) ............................ P2004-349920

(51) Int. Cl.
    *G06F 13/12* (2006.01)
(52) U.S. Cl. ..................... 710/66; 710/307; 365/189.02
(58) Field of Classification Search ............... 710/66, 710/316; 365/189, 233, 230, 189.02
    See application file for complete search history.

(56) References Cited

U.S. PATENT DOCUMENTS

| 4,868,784 | A | * | 9/1989 | Marshall et al. | ............. | 710/316 |
| 5,291,079 | A | * | 3/1994 | Goetting | ...................... | 326/38 |
| 6,134,178 | A | * | 10/2000 | Yamazaki et al. | ........... | 365/233 |
| 6,256,252 | B1 | * | 7/2001 | Arimoto | ..................... | 365/227 |
| 6,311,239 | B1 | * | 10/2001 | Matthews | .................... | 710/66 |
| 6,311,248 | B1 | * | 10/2001 | Meiyappan et al. | ......... | 710/307 |
| 7,342,977 | B2 | * | 3/2008 | Jenkins et al. | .............. | 375/295 |
| 2004/0172476 | A1 | * | 9/2004 | Chapweske | ................. | 709/231 |

FOREIGN PATENT DOCUMENTS

JP    3-79056 A    4/1991

* cited by examiner

*Primary Examiner*—Henry W. H. Tsai
*Assistant Examiner*—Elias Mamo
(74) *Attorney, Agent, or Firm*—McDermott Will & Emery LLP (57) ABSTRACT

A semiconductor integrated circuit provided with an (m×n)-bit output mode and an n-bit output mode and including a set of (m×n) I/O portions 103 for outputting signals to the outside, wherein data with a bus width of (m×n) bits are selected by a set of selectors 101 in the (m×n)-bit output mode so that the data with the bus width of (m×n) bits are outputted from the set of (m×n) I/O portions 103 whereas data with a bus width of n bits are multiply selected by the set of selectors 101 in the n-bit output mode so that the data with the bus width of n bits are outputted from the set of (m×n) I/O portions 103 while multiplexed in at least two I/O portions per bit. Every I/O portions which output one and the same bit are short-circuited externally to improve current drive capacity.

8 Claims, 7 Drawing Sheets

SEMICONDUCTOR INTEGRATED CIRCUIT

BACKGROUND OF THE INVENTION

1. Field of the Invention

The present invention relates to a semiconductor integrated circuit having a plurality of output modes with variable bus widths.

2. Description of the Related Art

There was a semiconductor integrated circuit in which the output bit width can be changed in accordance with a device connected to the outside of the semiconductor integrated circuit. For example, in a semiconductor integrated circuit having a 16-bit bus mode and an 8-bit bus mode, sixteen outgoing I/O portions are provided so that the sixteen outgoing I/O portions output respective bits of 16-bit data in the 16-bit bus mode whereas eight I/O portions corresponding to less significant 8 bits are selected from the sixteen outgoing I/O portions in the 8-bit bus mode and used for outputting data while the output for more significant 8 bits is fixed or the input for more significant 8 bits is pulled down or up.

Figure 7:
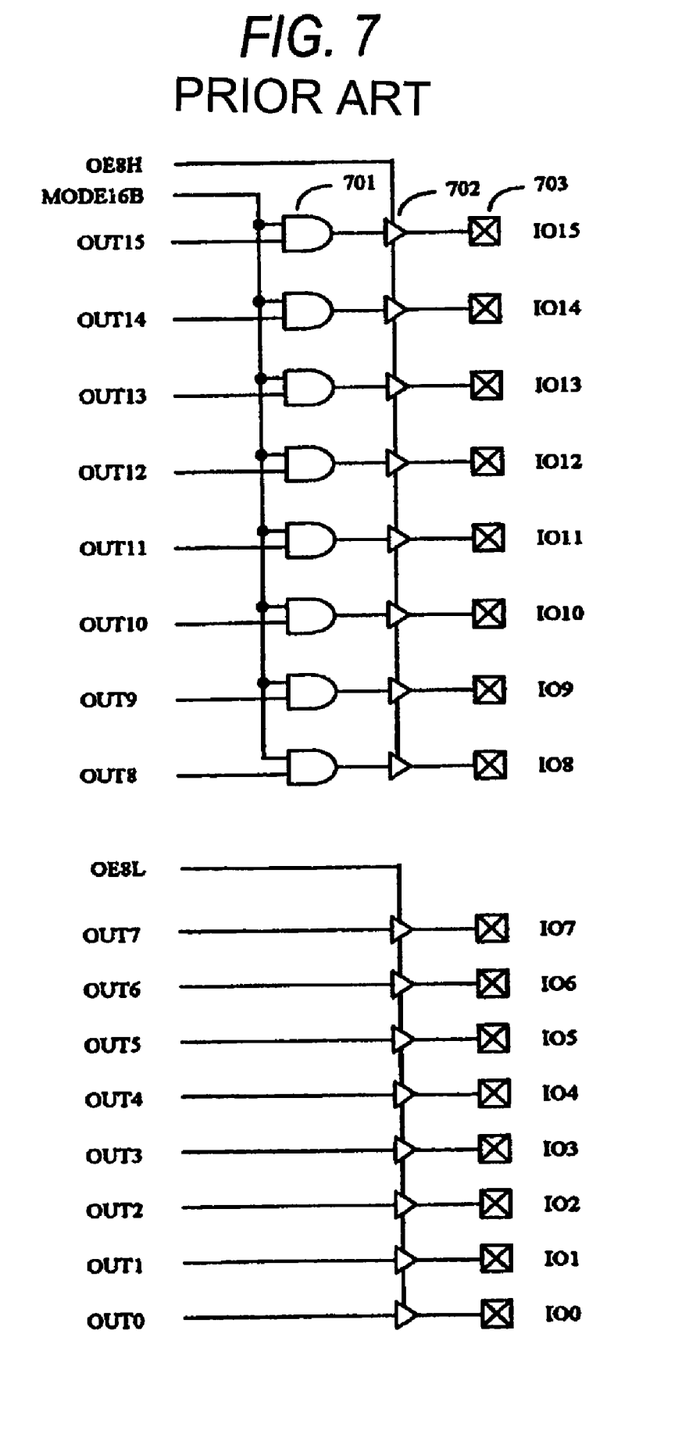
FIG. 7 is a diagram showing the configuration of I/O portions of a semiconductor integrated circuit according to the background art.

FIG. 7 is a diagram showing the configuration of I/O portions of a semiconductor integrated circuit according to the background art. The semiconductor integrated circuit according to the background art includes a set of AND circuits 701, a set of output buffers 702, and a set of outgoing I/O portions 703 (16 bits of IO0 to IO15). These constituent members 701 to 703 are separated into a group corresponding to more significant bits (IO8 to IO15) and a group corresponding to less significant bits (IO0 to IO7).

OUT0 to OUT15 are output signals generated by the internal operation of the semiconductor integrated circuit and outputted to the outside. MODE16B is an output mode switching signal. When MODE16B is high (H) in level, a 16-bit bus mode is selected. When MODE16B is low (L) in level, an 8-bit bus mode is selected. Specifically, when MODE16B is L, the output of the set of AND circuits is fixed to L to thereby select an 8-bit bus mode.

OE8H is an output control signal for controlling the set of output buffers 702 for the more significant bits. When OE8H is H, IO8 to IO15 are outputted normally. When OE8H is L, a half of the set of output buffers 702 corresponding to IO8 to IO15 become a high impedance state (HiZ). OE8L is an output control signal controlling the set of output buffers 702 for the less significant bits. When OE8L is H, IO0 to IO7 are outputted normally. When OE8L is L, a half of the set of output buffers 702 corresponding to IO0 to IO7 become HiZ.

In the 16-bit bus mode where MODE16B is H, OUT0 to OUT15 are outputted to IO0 to IO15 directly if OE8H is H and OE8L is H. In the 8-bit bus mode where MODE16B is L, the output for IO8 to IO15 is fixed to L if OE8H is H, but IO8 to IO15 are pulled down or up to pull-down or pull-up resistors if OE8H is L. When OE8L is H, OUT0 to OUT7 are outputted to IO0 to IO7 directly.

In this configuration, the quantity of data allowed to be outputted at once in the 8-bit output mode is a half of the quantity of data in the 16-bit output mode. For this reason, an output speed twice as high as the output speed in the 16-bit output mode is required in the 8-bit output mode for obtaining the same transfer rate as that in the 16-bit output mode. When such a high-speed operation is performed, increase in output current capacity is required.

As a technique for changing external output current capacity of a semiconductor integrated circuit, there has been heretofore proposed a semiconductor device having such a circuit configuration that transistor drive capacity can be changed on the basis of an external signal in order to improve the margin for test reading (e.g. see Japanese Patent Laid-Open No. 79056/1991).

As described above, if a constant transfer rate is required in data outputting in a semiconductor integrated circuit having a plurality of output modes with variable bus widths such as a 16-bit output mode and an 8-bit output mode, an output speed twice as high as that in the 16-bit output mode is required in the 8-bit output mode. There is a possibility that no mode but the 8-bit mode can be used for the structural reason of the external device. When such a high-speed operation is performed, the semiconductor integrated circuit cannot be operated normally if output current capacity is low.

The background-art technique for changing transistor drive capacity in the external output of the semiconductor integrated circuit is a technique by which transistor drive capacity can be lowered in order to improve the margin for test reading. The idea of changing external output current capacity in accordance with necessity is effective. This technique however has a disadvantage in that the external output circuit becomes complex because the transistor drive capacity is changed.

SUMMARY OF THE INVENTION

An object of the invention is to provide a semiconductor integrated circuit provided with a plurality of output modes with variable bus widths, in which output current drive capacity can be improved without use of any special external output circuit in an output mode with a small bus width, so that a high-speed operation can be performed to obtain the same data transfer rate as in an output mode with a large bus width.

The invention provides a semiconductor integrated circuit provided with a plurality of output modes including an (m×n)-bit (in which m is a natural number not smaller than 2 and n is a natural number) output mode and an n-bit output mode different in bus width, wherein: the semiconductor integrated circuit includes (m×n) I/O portions for outputting signals to the outside; in the (m×n)-bit output mode, the (m×n) I/O portions output data with a bus width of (m×n) bits; and in the n-bit output mode, the (m×n) I/O portions output data with a bus width of n bits so that the data are multiplexed in at least two I/O portions per bit.

According to the aforementioned configuration, (m−1)×n outgoing I/O portions which have been heretofore not used in the n-bit output mode can be used so that data can be outputted from at least two outgoing I/O portions per bit. Accordingly, output current drive capacity of at least two I/O portions per bit can be obtained in an external device by a method of short-circuiting the outgoing I/O portions which output one and the same data. As a result, current drive capacity twice or higher per bit can be obtained, so that the value of output delay can be reduced to make a high-speed operation possible.

In the invention, the semiconductor integrated circuit further includes first selectors for selecting signals to be transferred to the I/O portions respectively; and each of the first selectors selects one bit from data with the bus width of (m×n) bits in the (m×n)-bit output mode whereas each of the first selectors selects one bit from data with the bus width of n bits in the n-bit output mode.

Further, in the invention, the first selectors include (n−1) sets of m selectors, and a set of (m−1) selectors; and the selectors select different bits respectively from data with the bus width of (m×n) bits in the (m×n)-bit output mode whereas each set of selectors select one and the same bit from data with the bus width of n bits in the n-bit output mode.

According to the aforementioned configuration, data with a bus width of (m×n) bits can be outputted in the (m×n)-bit output mode whereas data with a bus width of n bits can be outputted multiply in accordance with each bit in the n-bit output mode. Accordingly, a circuit for giving current drive capacity twice or higher per bit in the n-bit output mode can be achieved easily.

Further, in the invention, the semiconductor integrated circuit further includes (m×n) tristate buffers for driving the (m×n) I/o portions respectively; and in the n-bit output mode, (k×n) tristate buffers (in which k is a natural number not smaller than 1 but smaller than m) among the (m×n) tristate buffers become high in impedance.

According to the aforementioned configuration, the tristate buffers are controlled so that the output mode of data with a bus width of n bits in the n-bit output mode can be selected as to whether the data are outputted multiply in accordance with bits or whether the data are outputted by use of one I/O portion per bit in accordance with condition. Accordingly, the trade-off relation between high speed and low noise can be selected in accordance with current drive capacity.

Further, in the invention, the (m×n) I/O portions are bidirectional I/O portions provided with (m×n) input buffers respectively.

Further, in the invention, the semiconductor integrated circuit further includes first selectors for selecting signals to be transferred to the I/O portions respectively, and second selectors for selecting signals to be inputted to the first selectors respectively; each of the first selectors selects one bit from data with the bus width of (m×n) bits in the (m×n)-bit output mode whereas the first selectors select bits corresponding to signals outputted from the second selectors in the n-bit output mode; and in the n-bit output mode, each of the second selectors selects one bit from data with the bus width of n bits or selects a signal different from the data with the bus width of (m×n) bits and different from the data with the bus width of n bits.

According to the aforementioned configuration, when one I/O portion per bit is selected in the n-bit output mode, the other I/O portion on the unused side can be used for outputting a signal such as a test signal or an ICE signal different from the ordinary output signal selected by each second selector.

Further, in the invention, in the case where m is equal to 2, a 2n-bit output mode and an n-bit output mode are provided; in the 2n-bit output mode, the s-th one ($1 \leq s \leq 2n$) of the 2n I/O portions outputting data with a bus width of 2n bits outputs the s-th bit of data with the bus width of 2n bits; and in the n-bit output mode, the (2t−1)-th and 2t-th ones ($1 \leq t \leq n$) of the 2n I/O portions output the t-th bit of data with the bus width of n bits.

According to the aforementioned configuration, data with a bus width of 2n bits can be outputted in order in the 2n-bit output mode while data with a bus width of n bits can be outputted in order to adjacent two I/O portions per bit in the n-bit output mode. Accordingly, in the n-bit output mode, current drive capacity twice per bit can be obtained easily when adjacent two I/O portions are short-circuited.

Further, in the invention, the semiconductor integrated circuit further includes (2n−1) selectors provided so as to correspond to the second to 2n-th ones of the 2n I/O portions; in the 2n-bit output mode, the s-th selector selects the s-th bit of data with the bus width of 2n bits; and in the n-bit output mode, the (2t−1)-th and 2t-th selectors select the t-th bit of data with the bus width of n bits.

According to the aforementioned configuration, it is easy to achieve a circuit which can output data with a bus width of 2n bits in order in the 2n-bit output mode, and which can output data with a bus width of n bits in order to adjacent two I/O portions per bit in the n-bit output mode.

Further, in the invention, ascending order of the (m×n) I/O portions can be switched over to descending order by setting, and vice versa.

According to the aforementioned configuration, a function useful for a specific purpose can be provided because ascending order of data outputted from the (m×n) I/O portions can be switched over to descending order, and vice versa.

According to the invention, in a semiconductor integrated circuit having a plurality of output modes with variable bus widths, current drive capacity can be improved without use of any special external output circuit in an output mode with a small bus width. Accordingly, the value of output delay becomes so small that a high-speed operation can be performed.

DESCRIPTION OF THE PREFERRED EMBODIMENTS

Embodiments of the invention will be described below with reference to the drawings. Incidentally, in the following description, signal H expresses a signal with a high level (logical value: 1), signal L expresses a signal with a low level (logical value: 0), and HiZ expresses a high impedance state of a tristate buffer.

Embodiment 1

Figure 1:
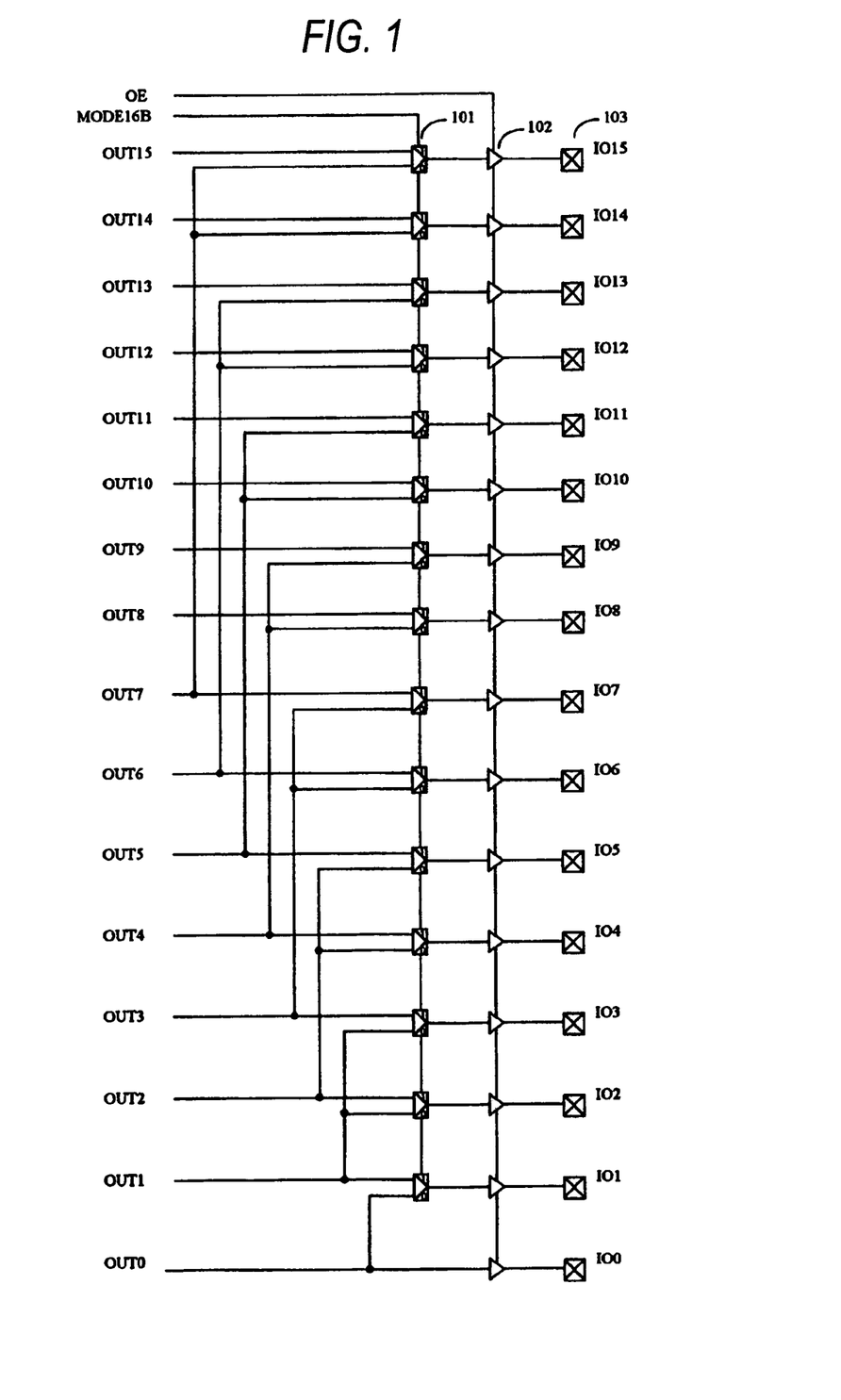
FIG. 1 is a diagram showing the configuration of I/O portions of a semiconductor integrated circuit according to Embodiment 1 of the invention.

FIG. 1 is a diagram showing the configuration of I/O portions of a semiconductor integrated circuit according to Embodiment 1 of the invention. In FIG. 1, the semiconductor integrated circuit includes a set of selectors 101, a set of output buffers (a set of tristate buffers) 102, and a set of outgoing I/O portions 103 (IO0 to IO15).

OUT0 to OUT15 are output signals generated by the operation of an internal circuit of the semiconductor integrated circuit and outputted to the outside. MODE16B is an output mode switching signal. When MODE16B is H, a 16-bit bus mode is selected. When MODE16B is L, an 8-bit bus mode is selected. OE is an output control signal. When OE is H, IO0 to IO15 perform ordinary outputting. When OE is L, the set of output buffers 102 for IO0 to IO15 become HiZ.

In the 16-bit bus mode where MODE16B is H, the set of selectors 101 select wires connected on upper sides respectively. As a result, OUT0 to OUT15 are connected to the outgoing I/O portions IO0 to IO15 respectively. If OE is H. OUT0 to OUT15 are outputted to the outgoing I/O portions IO0 to IO15 directly.

In the 8-bit bus mode where MODE16B is L, the set of selectors 101 select wires connected on lower sides respectively. As a result, OUT0 is connected to two outgoing I/O portions IO0 and IO1, OUT1 is connected to two outgoing I/O portions IO2 and IO3, OUT2 is connected to two outgoing I/O portions IO4 and IO5, OUT3 is connected to two outgoing I/O portions IO6 and IO7, OUT4 is connected to two outgoing I/O portions IO8 and IO9, OUT5 is connected to two outgoing I/O portions IO10 and IO11, OUT6 is connected to two outgoing I/O portions IO12 and IO13, and OUT7 is connected to two outgoing I/O portions IO14 and IO15.

OUT0 to OUT7 are output signals in the 8-bit bus mode. When OE is turned to H, two outgoing I/O portions per bit output one and the same data. Data can be inputted into an external device by use of two outgoing I/O portions per bit in such a manner that the two outgoing I/O portions are short-circuited.

Figure 6:
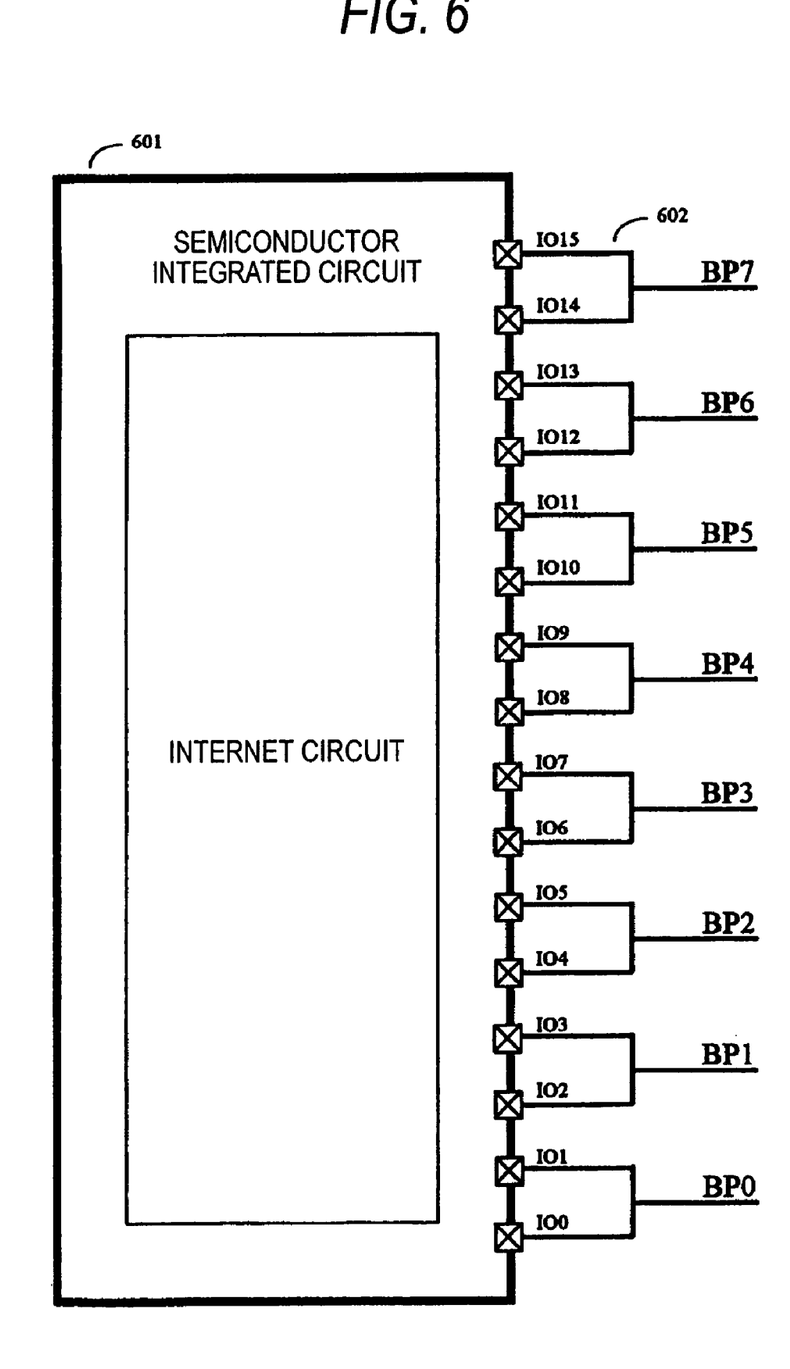
FIG. 6 is a view showing an example in which two outgoing I/O portions are short-circuited in board wiring.

FIG. 6 shows an example of configuration in the case where two outgoing I/O portions are short-circuited by use of board wiring. In FIG. 6, the reference numeral 601 designates a semiconductor integrated circuit having I/O portions according to this embodiment; 602, wiring on a board; and BP0 to BP7, external bus ports. When wiring is performed on the board in this manner, BP0 is connected to IO0 and IO1 so that current drive capacity of two outgoing I/O portions is obtained in accordance with OUT0. BP1 is connected to IO2 and IO3 so that current drive capacity of two outgoing I/O portions is obtained in accordance with OUT1. The same thing can be said on BP2 to BP7.

Embodiment 2

Although Embodiment 1 has been described on the case where IO0 to IO15 are used only as output portions, IO0 to IO15 can be used as bidirectional I/O portions. This embodiment shows the case where IO0 to IO15 are used as bidirectional I/O portions.

Figure 2:
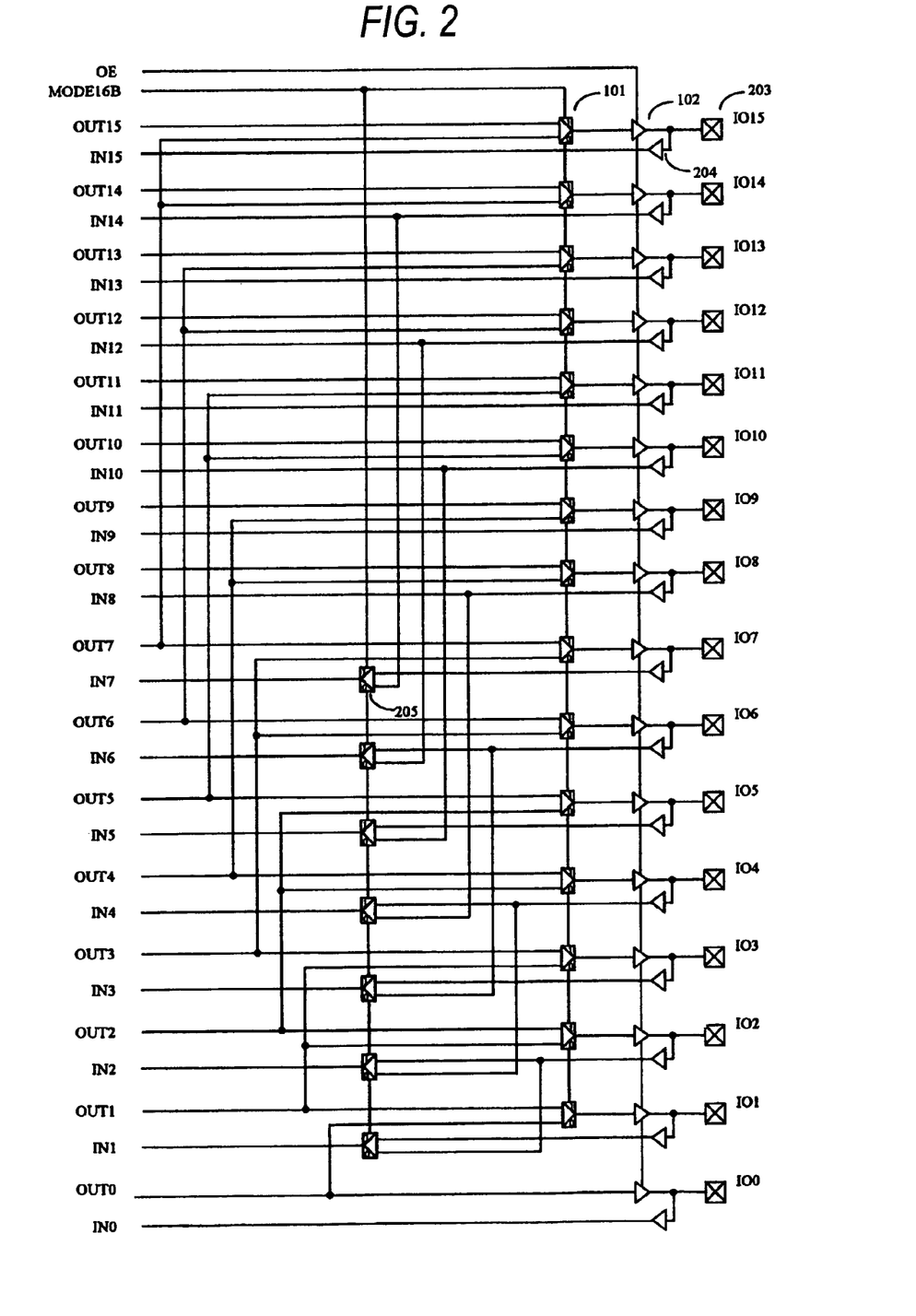
FIG. 2 is a diagram showing the configuration of I/O portions of a semiconductor integrated circuit according to Embodiment 2 of the invention.

FIG. 2 is a diagram showing the configuration of I/O portions of a semiconductor integrated circuit according to Embodiment 2 of the invention. In FIG. 2, the semiconductor integrated circuit includes a set of selectors 101, a set of output buffers (a set of tristate buffers) 102, a set of bidirectional I/O portions 203 (IO0 to IO15), a set of input buffers (a set of tristate buffers) 204, and a set of selectors 205.

OUT0 to OUT15 are output signals generated by the internal operation of the semiconductor integrated circuit and outputted to the outside. IN0 to IN15 are input signals inputted from an external device into the semiconductor integrated circuit.

MODE16B is an output mode switching signal. When MODE16B is H, a 16-bit bus mode is selected. When MODE16B is L, an 8-bit bus mode is selected. OE is an output control signal. When OE is H, IO0 to IO15 are outputted ordinarily. When OE is L, the set of output buffers 102 for IO0 to IO15 become HiZ.

Because the operation for outputting data is the same as in Embodiment 1, the description of the operation will be omitted here. This embodiment is different from Embodiment 1 in that the set of output buffers 102 are made HiZ to thereby input data from the external device into the semiconductor integrated circuit.

For inputting data in the 16-bit mode, while OE is turned to L to make the set of output buffers 102 HiZ, MODE16B is turned to H to make the set of selectors 205 select upper wires. Accordingly, data of IO0 is inputted into IN0, and data of IO1 is inputted into IN1. Data of IO2 to IO5 are inputted into IN2 to IN5 respectively in the same manner as described above.

For inputting data in the 8-bit mode, while OE is turned to L to make the set of output buffers 102 HiZ, MODE16B is turned to L. Accordingly, the set of selectors 205 select lower wires.

This embodiment will be described with reference to FIG. 6 showing a state in which the semiconductor integrated circuit is mounted on the board. In the 8-bit mode, data outputted from the external device to BP0 is inputted into IN0 via IO0. Similarly, data outputted to BP1 is inputted into IN1 via 102, and data outputted to BP2 is inputted into IN2 via 104. As for BP3 to BP7, data are inputted into IN3 to IN7 in the same manner as described above. Because the 8-bit mode is selected now, IN8 to IN15 are not used.

Embodiment 3

Although Embodiments 1 and 2 have been described on the case where two outgoing I/O portions per bit are made to perform the same operation in the 8-bit bus mode, the operation of only one outgoing I/O portion per bit may be required in accordance with the situation. This embodiment is achieved in such a manner that a function of selecting either two I/O portions or one I/O portion per bit as I/O portions operated in the 8-bit bus mode is added to Embodiment 2.

Figure 3:
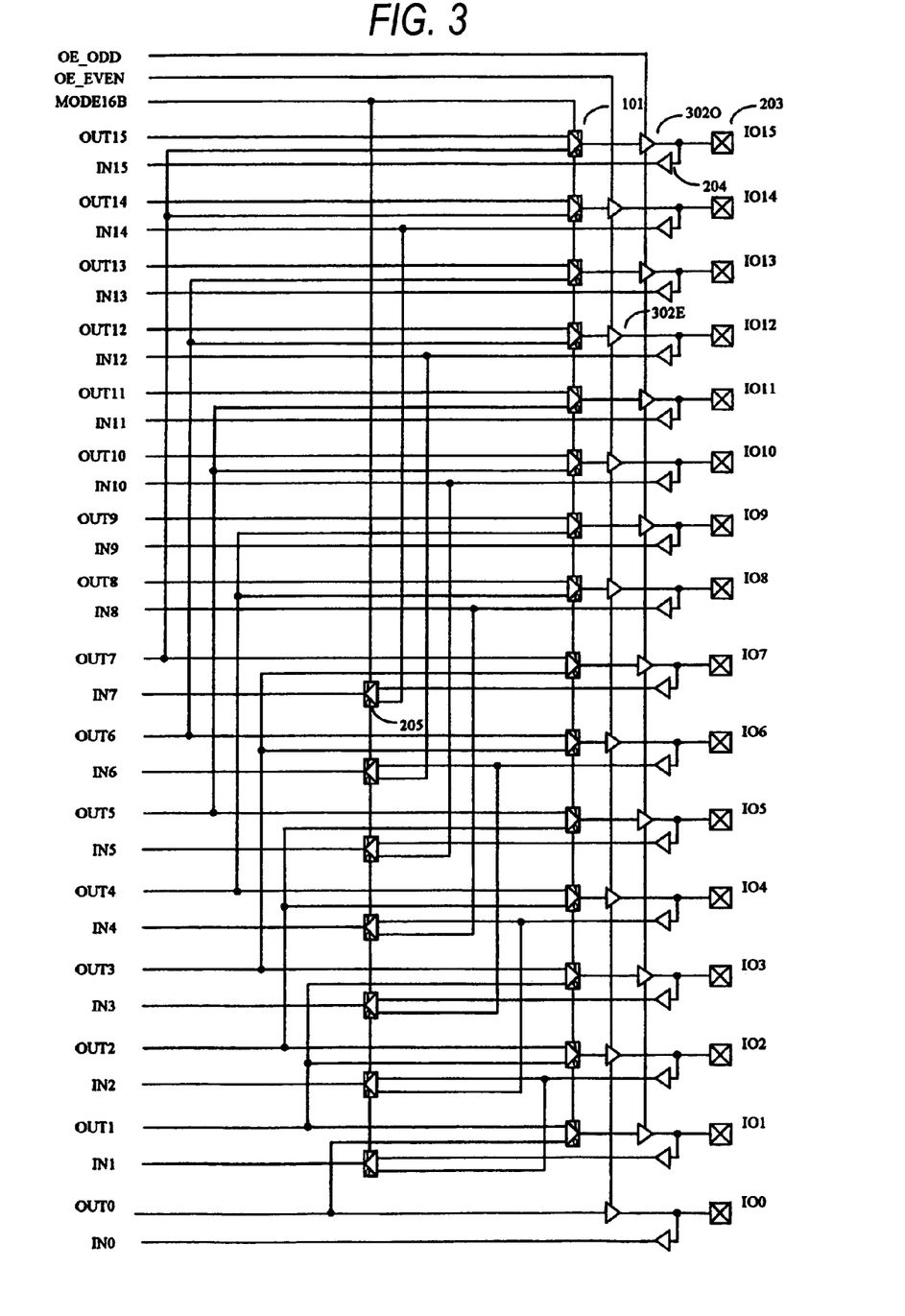
FIG. 3 is a diagram showing the configuration of I/O portions of a semiconductor integrated circuit according to Embodiment 3 of the invention.

FIG. 3 is a diagram showing the configuration of I/O portions of a semiconductor integrated circuit according to Embodiment 3 of the invention. The semiconductor integrated circuit shown in FIG. 3 is configured so that the set of output buffers 102 in Embodiment 2 shown in FIG. 2 is separated into a first set of output buffers 302E corresponding to even-number bits and a second set of output buffers 302O corresponding to odd-number bits, and that the first set of output buffers 302E and the second set of output buffers 302O are controlled by different signal lines respectively.

OE_EVEN is an output control signal for controlling the first set of output buffers 302E. OE_ODD is an output control signal for controlling the second set of output buffers 302O. When OE_EVEN is H, even-number bits IO0, IO2, IO4, IO6, IO8, IO10, IO12 and IO14 are outputted ordinarily. When OE_EVEN is L, the first set of output buffers 302E become HiZ. When OE_ODD is H, odd-number bits IO1, IO3, IO5, IO7, IO9, IO11, IO13 and IO15 are outputted ordinarily. When OE_ODD is L, the second set of output buffers 302O become HiZ.

In the 16-bit bus mode where MODE16B is H, OUT0 to OUT15 are outputted to IO0 to IO15 directly if OE_EVEN is H and OE_ODD is H. IO0 to IO15 are inputted into IN0 to IN15 directly if OE_EVEN is L and OE_ODD is L.

In the 8-bit bus mode where MODE16B is L, OUT0 is outputted to IO0 and IO1, OUT1 is outputted to IO2 and IO3, OUT2 is outputted to IO4 and IO5, OUT3 is outputted to IO6 and IO7, OUT4 is outputted to IO8 and IO9, OUT5 is outputted to IO10 and IO11, OUT6 is outputted to IO12 and IO13, and OUT7 is outputted to IO14 and IO15 if OE_EVEN is H and OE_ODD is H.

When two I/O portions are short-circuited by use of board wiring as shown in FIG. 6 in the same manner as in Embodiment 1, BP0 is connected to IO0 and IO1 so that current drive capacity of two outgoing I/O portions is obtained in accordance with OUT0. BP1 is connected to IO2 and IO3 so that current drive capacity of two outgoing I/O portions is obtained in accordance with OUT1. The same thing can be said on BP2 to BP7.

When OE_EVEN is H and OE_ODD is L in the 8-bit bus mode, OUT0 is outputted to IO0 while the second output buffer corresponding to IO1 becomes HiZ. Similarly, OUT1 is outputted to IO2, OUT2 is outputted to IO4, OUT3 is outputted to IO6, OUT4 is outputted to IO8, OUT5 is outputted to IO10, OUT6 is outputted to IO12, and OUT7 is outputted to IO14 while the second buffers corresponding to IO3, IO5, IO7, IO9, IO11, IO13 and IO15 become HiZ.

When two I/O portions are short-circuited by use of board wiring as shown in FIG. 6, current drive capacity of one I/O portion is obtained in BP0 because one IO1 of the I/O portions IO0 and IO1 connected to BP0 is HiZ. The same thing can be said on BP1 to BP7, so that current drive capacity of one I/O portion is obtained in each of the BP1 to BP7.

Next, an input operation in the 8-bit bus mode in the case of use of board wiring as shown in FIG. 6 will be described. When OE_EVEN is L, BP0 is inputted into IN0 via IO0. Similarly, BP1 is inputted into IN1 via IO2, and BP2 is inputted IN2 via 104. BP3 to BP7 are inputted into IN3 to IN7 respectively in the same manner as described above. Because IN8 to IN15 are not used in the 8-bit bus mode, the signal state of OE_ODD can be neglected.

As described above, when controlling is performed in the 8-bit bus mode while the set of output buffers is separated into a set of output buffers corresponding to even-number bits and a set of output buffers corresponding to odd-number bits, either use of one I/O portion per bit or use of two I/O portions per bit can be selected so that current drive capacity can be selected in accordance with the situation.

Generally, when output current capacity is high, high frequency can be used because the delay value is small, but noise caused by EMI or the like is high. On the other hand, when output current capacity is low, noise caused by EMI or the like is low but high frequency cannot be used because the delay value is large. Although the operating frequency has a trade-off relation with noise as described above, the output current value can be selected at a point of good balance between the two when configuration is made so that current drive capacity can be selected.

Although this embodiment is based on Embodiment 2 and configured so that a function of selecting current drive capacity is added to Embodiment 2, it is a matter of course that this function may be combined with Embodiment 1 for use of outgoing I/O portions.

Embodiment 4

Although Embodiments 1 to 3 have been described on the case where only OUT0 to OUT7 can perform outputting in the 8-bit bus mode, this embodiment is configured so that either use of two I/O portions per bit or use of one I/O portion per bit can be selected as I/O operated in the 8-bit bus mode in the same manner as in Embodiment 3. When use of one I/O portion per bit is selected, the other I/O portion on the unused side is used so that a signal such, as a test signal or an ICE signal different from the ordinary output signal can be outputted.

Figure 4:
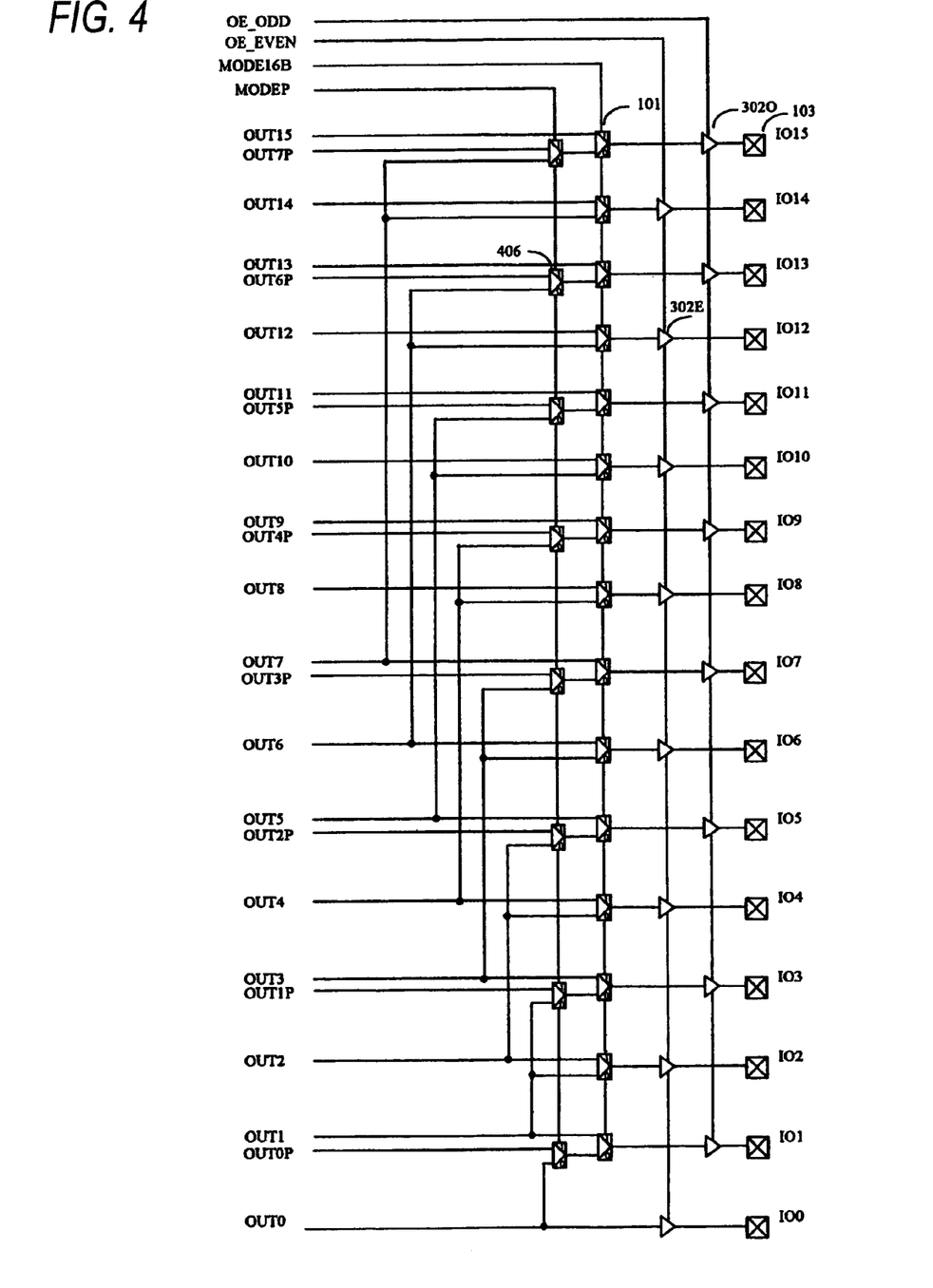
FIG. 4 is a diagram showing the configuration of I/O portions of a semiconductor integrated circuit according to Embodiment 4 of the invention.

FIG. 4 is a diagram showing the configuration of I/O portions of a semiconductor integrated circuit according to Embodiment 4 of the invention. The semiconductor integrated circuit shown in FIG. 4 is configured so that the set of output buffers 102 in FIG. 1 is separated into a first set of output buffers 302E corresponding to even-number bits and a second set of output buffers 302O corresponding to odd-number bits, that the first set of output buffers 302E and the second set of output buffers 302O are controlled by different signal lines respectively, and that a set of selectors 406 for selecting signals different from the ordinary output signals is added to the configuration shown in FIG. 1.

OUT0 to OUT15 are ordinary output signals generated by the internal operation of the semiconductor integrated circuit and outputted to the outside. OUT0P to OUT7P are output signals different from the ordinary output signals. MODE16B is an output mode switching signal. When MODE16B is H, a 16-bit bus mode is selected. When MODE16B is L, an 8-bit bus mode is selected.

OE_EVEN is an output control signal for controlling the first set of output buffers 302E. OE_ODD is an output control signal for controlling the second set of output buffers 302O. When OE_EVEN is H, even-number bits IO0, IO2, IO4, IO6, IO8, IO10, IO12 and IO14 are outputted ordinarily. When OE_EVEN is L, the first set of output buffers 302E become HiZ. When OE_ODD is H, odd-number bits IO1, IO3, IO5, IO7, IO9, IO11, IO13 and IO15 are outputted ordinarily. When OE_ODD is L, the second set of output buffers 302O become HiZ.

The operation in the 16-bit bus mode where MODE16B is H is the same as in Embodiments 1 to 3. The operation in the 8-bit bus mode where MODE16B is L is the same as in Embodiment 1 if OE_EVEN is H, OE_ODD is H and MODEP is L. The operation in the case where OE_EVEN is H and OE_ODD is L is the same as in Embodiment 2 regardless of whether MODEP is L or H.

In the 8-bit bus mode where MODE16B is L, OUT0 is outputted to IO0, OUT0P is outputted to IO1, OUT1 is outputted to IO2, OUT1P is outputted to IO3, OUT2 is outputted to IO4, OUT2P is outputted to IO5, OUT3 is outputted to IO6, OUT3P is outputted to IO7, OUT4 is outputted to IO8, OUT4P is outputted to IO9, OUT5 is outputted to IO10, OUT5P is outputted to IO11, OUT6 is outputted to IO12, OUT6P is outputted to IO13, OUT7 is outputted to IO14, and OUT7P is outputted to IO15 if OE_EVEN is H, OE_ODD is H and MODEP is H.

As described above, selection of either current drive capacity of one I/O portion per bit or current drive capacity of two I/O portions per bit can be controlled by OE_ODD in the 8-bit bus mode. Moreover, while current drive capacity of one I/O portion per bit is selected on the basis of MODEP's control, the other I/O portion can be used for outputting another signal.

Although this embodiment is configured so that I/O portions are used as outgoing I/O portions, it is a matter of course that this embodiment may be combined with Embodiment 3 so that I/O portions are used as bidirectional I/O portions.

Embodiment 5

Figure 5:
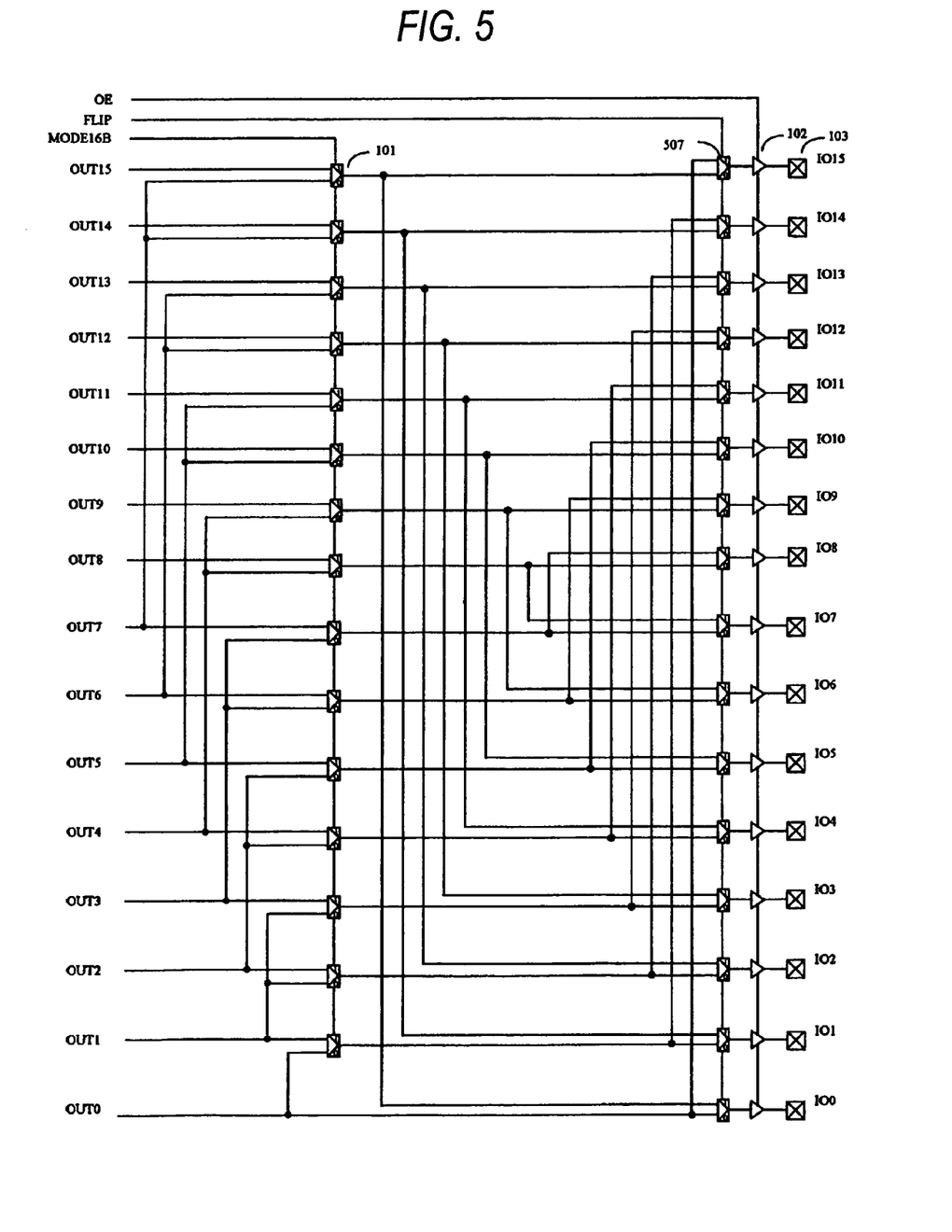
FIG. 5 is a diagram showing the configuration of I/O portions of a semiconductor integrated circuit according to Embodiment 5 of the invention.

FIG. 5 is a diagram showing the configuration of I/O portions of a semiconductor integrated circuit according to Embodiment 5 of the invention. This embodiment is configured so that ascending order of I/O can be switched over to descending order, and vice versa, and that a set of selectors 507 for switching ascending order of I/O over to descending order are added to the configuration shown in FIG. 1.

MODE16B is an output mode switching signal. When MODE16B is H, a 16-bit bus mode is selected. When MODE16B is L, an 8-bit bus mode is selected. OE is an output control signal. When OE is H, IO0 to IO15 are outputted ordinarily. When OE is L, the set of output buffers 102 for IO0 to IO15 become HiZ. FLIP is a control signal given to the set of selectors 507 for selecting either ascending order or descending order of I/O.

When MODE16B is H and FLIP is L, a normal 16-bit bus mode is selected. If OE is H, OUT0 to OUT15 are outputted to IO0 to IO15 directly. When MODE16B is H and FLIP is H, an inverted 16-bit bus mode is selected. If OE is H, the bit order of OUT0 to OUT15 is inverted so that OUT0 to OUT15 are outputted to IO15 to IO0 respectively.

When MODE16B is L and FLIP is L, a normal 8-bit bus mode is selected. If OE is H, OUT0 is outputted to IO0 and IO1, OUT1 is outputted to IO2 and IO3, OUT2 is outputted to IO4 and IO5, OUT3 is outputted to IO6 and IO7, OUT4 is outputted to IO8 and IO9, OUT5 is outputted to IO10 and IO11, OUT6 is outputted to IO12 and IO13, and OUT7 is outputted to IO14 and IO15.

When two I/O portions are short-circuited by use of board wiring as shown in FIG. 6 in the same manner as in Embodiment 1, BP0 is connected to IO0 and IO1 so that current drive capacity of two outgoing I/O portions is obtained in accordance with OUT0. BP1 is connected to IO2 and IO3 so that current drive capacity of two outgoing I/O portions is obtained in accordance with OUT1. The same thing can be said on BP2 to BP7.

When MODE16B is L and FLIP is H, an inverted 8-bit bus mode is selected. If OE is H, OUT0 is outputted to IO15 and IO14, OUT1 is outputted to IO13 and IO12, OUT2 is outputted to IO11 and IO10, OUT3 is outputted to IO9 and IO8, OUT4 is outputted to IO7 and IO6, OUT5 is outputted to IO5 and IO4, OUT6 is outputted to IO3 and IO2, and OUT7 is outputted to IO1 and IO0.

Also in this case, when two I/O portions are short-circuited by use of board wiring as shown in FIG. 6, BP0 is connected to IO0 and IO1 so that current drive capacity of two outgoing I/O portions is obtained in accordance with OUT7. BP1 is connected to IO2 and IO3 so that current drive capacity of two outgoing I/O portions is obtained in accordance with OUT6. The same thing can be said on BP2 to BP7.

Although this embodiment is based on Embodiment 1, it is a matter of course that this embodiment may be combined with any one of Embodiments 2 to 4.

The semiconductor integrated circuit according to the invention has an effect of reducing the value of output delay to make a high-speed operation possible because current drive capacity can be improved without use of any special external output circuit in an output mode with a small bus width in a semiconductor integrated circuit having a plurality of output modes with variable bus widths. The semiconductor integrated circuit according to the invention is useful as a semiconductor integrated circuit etc. having a plurality of output modes with variable bus widths.

What is claimed is:

1. A semiconductor integrated circuit provided with a plurality of output modes including a variable (m×n) bit output mode, in which m is a natural number not smaller than 2, and n is a natural number; and an n-bit output mode, comprising:
   (m×n) input/output I/O portions outputting signals to the outside;
   wherein in the variable (m×n)-bit output mode, the (m×n) I/O portions output data for a bus width of (m×n) bits; and
   in the n-bit output mode, the (m×n) I/O portions output data for a bus width of n bits,
   wherein in the n-bit output mode, at least two of the (m×n) I/O portions outputs the same data simultaneously for each of said n bits,
   wherein:
   in the case where m is equal to 2, a 2n-bit output mode and an n-bit output mode are provided;
   in the 2n-bit output mode, s-th one ($1 \leq s \leq 2n$) of 2n I/O portions outputting data with a bus width of 2n bits outputs an s-th bit of data with the bus width of 2n bits; and
   in the n-bit output mode, (2t−1)-th and 2t-th ones ($1 \leq t \leq n$) of 2n I/O portions output a t-th bit of data with the bus width of n bits.

2. The semiconductor integrated circuit according to claim 1, further comprising:
   first selectors for selecting signals to be transferred to the I/O portions respectively; and
   each of the first selectors selects one bit from data with the bus width of (m×n) bits in the (m×n)-bit output mode whereas each of the first selectors selects one bit from data with the bus width of n bits in the n-bit output mode.

3. The semiconductor integrated circuit according to claim 2, wherein:
   the first selectors include (n−1) sets of m selectors, and a set of (m−1) selectors; and
   the selectors select different bits respectively from data with the bus width of (m×n) bits in the (m×n)-bit output mode whereas each set of selectors select one and the same bit from data with the bus width of n bits in the n-bit output mode.

4. The semiconductor integrated circuit according to claim 1, further comprising:
   (m×n) tristate buffers driving the (m×n) I/O portions respectively;
   wherein, in the n-bit output mode, (k×n) tristate buffers (in which k is a natural number not smaller than 1 but smaller than m) among the (m×n) tristate buffers become high in impedance.

5. The semiconductor integrated circuit according to claim 1, wherein the (m×n) I/O portions are bidirectional I/O portions provided with (m×n) input buffers respectively.

6. The semiconductor integrated circuit according to claim 1, further provided with an output mode that outputs a signal different from the data at the same time, comprising:
   first selectors selecting signals to be transferred to the I/O portions respectively; and
   second selectors selecting signals to be inputted to the first selectors respectively;
   wherein each of the first selectors selects one bit from data with the bus width of (m×n) bits in the variable (m×n) bit output mode for outputting the data with the bus width of the (m×n) bits whereas the first selectors select bits corresponding to signals outputted from the second selectors in the variable n-bit output mode for outputting the data with the bus width of the n bits and the output mode that outputs a signal different from the data at the same time;
   in the variable n-bit output mode for outputting the data with the bus width of the n bits, each of second selectors selects one bit from data with the bus width of n-bits; and
   in the output mode that outputs a signal different from the data at the same time, each of the second selectors selects a signal different from the data with the bus width of (m×n)-bits and different from the data with the bus width of n-bits.

7. The semiconductor integrated circuit according to claim 1, further comprising:
   (2n−1) selectors, provided so as to correspond to second to 2n-th ones of the 2n I/O portions;
   wherein in the 2n-bit output mode, an s-th selector selects the s-th bit of data with the bus width of 2n bits; and
   in the n-bit output mode, (2t−1)-th and 2t-th selectors select the t-th bit of data with the bus width of n bits.

8. The semiconductor integrated circuit according to claim 1, wherein ascending order of the (m×n) I/O portions can be switched over to descending order by setting, and vice versa.

* * * * *